US011855111B2

(12) United States Patent
Oskotsky et al.

(10) Patent No.: US 11,855,111 B2
(45) Date of Patent: Dec. 26, 2023

(54) MWIR LENS FOR REMOTE SENSING

(71) Applicant: BAE SYSTEMS Information and Electronic Systems Integration Inc., Nashua, NH (US)

(72) Inventors: Mark L. Oskotsky, Mamaroneck, NY (US); Thomas Altamura, Hicksville, NY (US); Daniel Engheben, Commack, NY (US); Morgan Jolley, Commack, NY (US); Christopher V. Lipari, Whitestone, NY (US); Vincent Lipari, Whitestone, NY (US); Jerry Ma, Flushing, NY (US); Michael J. Russo, Jr., Roslyn, NY (US); Yueli Zhang, Saint James, NY (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 318 days.

(21) Appl. No.: 17/238,477

(22) Filed: Apr. 23, 2021

(65) Prior Publication Data

US 2022/0352231 A1  Nov. 3, 2022

(51) Int. Cl.
*H01L 27/146* (2006.01)
*G02B 3/00* (2006.01)
(Continued)

(52) U.S. Cl.
CPC ...... *H01L 27/14627* (2013.01); *G02B 3/0037* (2013.01); *G02B 9/12* (2013.01); *G02B 13/0005* (2013.01); *G02B 13/14* (2013.01)

(58) Field of Classification Search
CPC ... H01L 27/14627; G02B 3/0037; G02B 9/12; G02B 13/0005; G02B 13/14; G02B 9/64;
(Continued)

(56) References Cited

U.S. PATENT DOCUMENTS 5,373,151 A   12/1994 Eckel, Jr.
5,400,161 A   3/1995 Lambert, Jr.
(Continued)

FOREIGN PATENT DOCUMENTS

CN   102509416 A   6/2012
CN   107505690 A   12/2017
(Continued)

OTHER PUBLICATIONS

British Search Report, GB2205724.4, dated Oct. 19, 2022, 6 pages.
(Continued)

*Primary Examiner* — Joseph P Martinez
*Assistant Examiner* — Grant A Gagnon
(74) *Attorney, Agent, or Firm* — Maine Cernota & Curran; Gary McFaline

(57) ABSTRACT

A Mid-Wave Infrared (MWIR) objective lens having an F # of 2.64 and a 33.6° angular field of view. It is deployed, with a focal plane and scanning system, on an airborne platform for remote sensing applications. Focal length is 9 inches, and the image is formed on a focal plane constituting CCD or CMOS with micro lenses. The lens has, from object to image, three optical element groups with a cold shield/aperture stop. Group 1 has a positive optical power and three optical elements; Group 2 has a positive optical power and four optical elements; Group 3 has a positive optical power and three optical elements. The objective lens is made of two Germanium and Silicon. The lens is both apochromatic and orthoscopic, and corrected for monochromatic and chromatic aberrations over 3.3 to 5.1 micrometers.

19 Claims, 9 Drawing Sheets

(51) Int. Cl.
*G02B 13/00* (2006.01)
*G02B 9/12* (2006.01)
*G02B 13/14* (2006.01)

(58) Field of Classification Search
CPC . G02B 26/01; G02B 17/0848; G02B 17/0896
See application file for complete search history.

(56) References Cited

U.S. PATENT DOCUMENTS

| | | | |
|---|---|---|---|
| 8,101,918 B1 * | 1/2012 | Mercado | G02B 13/14 |
| | | | 359/357 |
| 8,867,140 B2 | 10/2014 | Oskotsky | |
| 9,091,840 B1 * | 7/2015 | Vizgaitis | G02B 9/64 |
| 9,297,987 B2 | 3/2016 | Oskotsky | |
| 2012/0162750 A1 | 6/2012 | Vizgaitis | |
| 2013/0076900 A1 | 3/2013 | Mrozek et al. | |
| 2020/0142160 A1 | 5/2020 | Oskotsky | |

FOREIGN PATENT DOCUMENTS

| | | |
|---|---|---|
| CN | 109324392 A | 2/2019 |
| WO | 2018236344 A1 | 12/2018 |

OTHER PUBLICATIONS

Office Action for U.S. Appl. No. 17/408,537 dated Sep. 20, 2023, 18 pages.

\* cited by examiner

MRTD TARGET

SILICON REFRACTIVE INDEX CHANGE WITH TEMPERATURE

THERMAL POWERS FOR SOME COMMON IR MATERIALS

INFRARED MATERIALS DISPERSION CHART

MWIR LENS

MWIR LENS PERSPECTIVE 3D VIEW

MWIR LENS FOR REMOTE SENSING

STATEMENT OF GOVERNMENT INTEREST

The present disclosure was developed under Contract No. FA8620-16-G-3013 awarded by the United States Air Force, and the United States Government has certain rights thereto.

FIELD

Embodiments relate to a MidWave InfraRed (MWIR) lens for sensing, and more particularly, to an infrared lens objective used in an airborne remote sensing system, producing an image with a spectral wavelength such as in the range of 3 to 5 micrometers.

BACKGROUND

The infrared lens objective is one of the most important subsystems of the remote sensing system. Its function is to collect the maximum amount of radiated energy from the target scene and project the image of the scene onto the system focal plane. It also establishes the critical sensor system performance parameters of target resolution, field of view, image quality and image rectilinearity.

In general, Infrared (IR) optical system design has a number of considerations and tradeoffs that make the process and configuration more complex. These include image spot size versus focal plane pixel size and pitch, transmittance and thermal performance of infrared lens objective materials, vignetting by lens elements and most importantly cold shield efficiency.

These considerations are in addition to the overall goals of maximizing system resolving-power, maintaining good area coverage, maximizing light collection and minimizing system size, cost and weight.

MWIR lenses are widely used in airborne imaging sensors designed for high resolution and wide wavelength range imaging applications such as reconnaissance, surveillance and mapping. For these applications, the lens must meet strict optical requirements over the wavelength range of about 3.3 micrometers to 5.1 micrometers. MWIR lenses typically utilize a number of materials to provide the necessary optical performance. The application of a high performance MWIR lens allows for a sensor system with reduced size, weight, power and complexity (SWAP-C). The lens objective must also provide high transmittance, high resolution, low distortion and a flat image over large field of view.

For IR imaging systems, which detect the thermal radiation from objects, an important measure of performance is the ability to detect small changes in temperature, called thermal resolution. The smallest temperature difference a system can distinguish from the background noise (and therefore can display) is called the thermal resolution. Temperature changes smaller than the thermal resolution will not be detected. Often thermal resolution is described by NETD, which stands for Noise-Equivalent-Temperature-Difference. NETD is the temperature difference in which the signal power detected is equal to the noise-equivalent-power (NEP).

The thermal resolution (or NETD) can be improved by increasing the size of the detecting elements, since more flux will be collected by each element. Unfortunately, this degrades the spatial resolution, by increasing the IFOV. As a general result (which is not proven here) the thermal and spatial resolution are inversely proportional.

Since it is not possible to simultaneously achieve high spatial and thermal resolution, neither is a good measure of the overall IR imaging system performance. A single quantity, called the Minimum Resolvable Temperature Difference (MRTD), measures both performance factors simultaneously. MRTD is determined experimentally and therefore takes into account all of the various contributing factors. Measurement of MRTD is done by slowly heating a test pattern at some range from the detector. A typical test pattern is shown in FIG. 1 (Prior Art).

The spacing from one bar to another is a single cycle of the test pattern. For a spacing of d millimeters, the spatial frequency is 1/d with units of cycles/millimeter. Since the spatial extent is related to the IFOV by the range, the spatial frequency can be expressed as cycles/milliradian calculated from 1000/(R d).

MRTD is the temperature difference at which bars of a particular frequency first become visible against the background. MRTD has units of degrees C. at a given spatial frequency (in cycles/milliradian). MRTD combines both spatial and thermal resolution into a single quantity that can be used to compare systems.

MWIR lenses designed for high resolution and wide wavelength range imaging applications such as reconnaissance, surveillance and mapping are often deployed in airborne platforms. For a broad applicability of airborne platforms, the lens must be able to perform over a wide environmental temperature range. To meet the critical sensor system performance parameters of target resolution and image quality, the lens must specifically be able to maintain focus over the specified environmental temperature range. Focus changes with temperature can be quite large, reducing the tolerable environmental temperature range of an optical system.

Considering the simple case of a single element thin lens, the change in focal length of the lens with temperature is given by:

$$\Delta f = -\gamma f \Delta T = -\left(\frac{dn/dT}{n-1} - \alpha_L\right) f \Delta T$$

Where:
γ=thermo-optical coefficient of the lens
dn/dT=refractive index change with temperature
n=refractive index of the lens
$\alpha_L$=thermal expansion coefficient (TCE) of the lens
f=focal length of the lens
ΔT=temperature change Further considering the simple case of this lens housing, the expansion of the housing with temperature is given by:

$$\Delta L = \alpha_H L \Delta T$$

Where
$\alpha_H$=thermal expansion coefficient (TCE) of the housing
L=length of the housing In the case of most IR materials r is positive and indicates a negative change in focal length with increasing temperature, while the housing expands, giving the total amount of defocus as:

$$\Delta z = \Delta L - \Delta f$$

From aberration theory, the depth of focus for a diffraction limited imaging system (γ/4) is given by:

$$\Delta z = \pm 2\lambda (F/\#)^2$$

Where

F/#=f/D (focal length/clear aperture diameter)

Combining the above gives the tolerable temperature change for a single element thin lens:

$$\Delta T = \pm \frac{2\lambda(F/\#)}{D(\alpha_H + \gamma)}$$

As an example, for an MWIR objective made of a single Germanium lens the tolerable temperature change is shown in the figure below. As illustrated in FIG. 2 (Prior Art), the amount of tolerable temperature change decreases with increasing lens size/decreasing f/#.

As it is often not possible to hold the IR system within tolerable temperature limits, some method that compensates for the change in focus with temperature must be employed. This is known as athermalization and the choice of technique ultimately depends on the application for which the IR system is to be used. The techniques for athermalization fall into three main categories:

1. Electro-mechanically active
2. Mechanically passive
3. Optically passive

Each option must be appropriately weighed with respect to the cost, performance, etc. for the system under consideration. Many systems incorporating these techniques have been designed, built, and tested.

TABLE 1

| Material | CTE (×10–6 K–1) |
|---|---|
| Aluminum | 23.6 |
| Invar | 0.5 to 2.0 |
| 1025 Steel | 12.0 |
| AlBeMet | 13 |

By using two different materials with very different thermal expansions arranged as either differential expansion cylinders or rods, it is possible to move the compensating element directly. The rods or cylinders must be of sufficient length to give the required differential movement.

Consider combining spacers of length $L_1$ and $L_2$ of materials with thermal coefficients of expansion $\alpha_1$ and $\alpha_2$ respectively, then to athermalize over a distance L requires that:

$$\alpha_1 L_1 + \alpha_2 L_2$$

$$L_1 + L_2 = L$$

To achieve passive mechanical athermalization housing materials and lengths are carefully chosen to compensate for thermal focus shift. Optically passive athermalization eliminates the thermally induced defocus in the system by combining suitably chosen lens materials that together compensate for thermal focus shift. Typical MWIR lens materials properties are shown in Table 2 below.

TABLE 2

| Material | Refractive Index @4 | Refractive Index @10µ | CTE (ppm/K) | dn/dT (ppm/K) | Knoop Hardness (g/mm2) | Spectral Range |
|---|---|---|---|---|---|---|
| Germanium | 4.0243 | 4.0032 | 6 | 396 | 800 | 2.0-17.0 µm |
| Silicon | 3.4255 | N/A | 2.7 | 150 | 1150 | 1.2-9.0 µm |
| ZnS (Cleartran) | 2.2523 | 2.2008 | 4.6 | 54 | 230 | 0.37-14.0 µm |
| ZnSe | 2.4331 | 2.4065 | 7.1 | 60 | 105 | 0.55-20.0 µm |
| Magnesium Fluoride | 1.3526 | N/A | 8 | 20 | 415 | 0.11-7.5 µm |
| Sapphire | 1.6753 | N/A | 5.6 | 13.7 | 1370 | 0.17-5.5 µm |
| Gallium Arsenide | 3.3069 | 3.2778 | 5.7 | 148 | 721 | 0.9-16.0 µm |
| CaF$_2$ | 1.4097 | 1.3002 | 18.9 | −11 | 170 | 0.13-10.0 µm |
| BaF$_2$ | 1.458 | 1.4014 | 18.4 | −15 | 82 | 0.15-12.5 µm |

Electro-mechanical active athermalization relies on lens elements being moved in a controlled manner by electro-mechanical devices using information from separate temperature sensors or image quality metrics. This requires a complex servo-mechanism design and is most suitable in optical systems such as zoom lenses in which an electro-mechanical focus mechanism already exists. The main advantages of this method are they can cope with thermal gradients through the system, easily cope with non-linear effects, and there is no thermal inertia (temperature sensors can be placed at the compensator elements). Disadvantages of this technique of athermalization are decreased reliability, increased size, weight, power, complexity and cost (SWAP-C^2).

Mechanical passive athermalization essentially involves some method of moving a lens element or elements through the thermal expansion of the lens structure material by an amount that compensates for thermal defocus. A large number of materials can be utilized as spacers or structural elements, with a correspondingly wide range of expansion coefficients. Some choices in MWIR structure materials are given in the coefficients of thermal expansion (CTE) for most common Opto-mechanical materials Table 1 below:

If the lens undergoes a change in temperature, its material properties can vary greatly causing a significant change in its optical property of index of refraction with respect to temperature, referred to as dn/dt. The dn/dt changes the optical power and focusing ability of the lens. The dn/dt values for the Silicon and Germanium are given below:

FIG. 3 (Prior Art) depicts the silicon refractive index change with temperature. As depicted, the index of refraction increases with temperature.

FIG. 4 (Prior Art) depicts the Germanium refractive index change through temperature and spectrum.

When a lens undergoes a change in temperature, its physical dimensions can also change. The characterization of this amount of dimensional change with thermal change is referred to as the material's Coefficient of Thermal Expansion (CTE). The CTE effects also cause a change in the optical power and focusing ability of the lens. CTE and dn/dt of the materials in a lens are the leading causes of focus shifts in MWIR imaging systems. In most cases, these effects can be mitigated through the athermalization techniques noted previously.

The combined effects of dn/dt and CTE can be characterized by the thermal power of the lens. The thermal power of the lens is given by:
Thermal Power:

$$\gamma = \frac{1}{(n_{ref} - 1)} \frac{\partial n}{\partial T} - \alpha$$

∂n/∂T is the change of index with respect to temperature, $n_{ref}$ is the index of refraction at the reference temperature, and α is the linear coefficient of thermal expansion. FIG. 5, Chart 5, shows thermal powers for some common IR materials.

FIG. 5 (Prior Art) is a chart showing thermal powers for some common IR materials. As can be seen, thermal powers of lens materials can be negative or positive, so suitable combinations of materials and powers can be arranged so that a lens is passively optically athermalized.

In order for the MWIR objective lens to have good overall imaging performance, besides maintaining focus over its environmental temperature range, it must also maintain focus across its operating wavelength range as well. When a lens maintains good focus over its wavelength range it is considered achromatized. When not achromatized, the lens focus point for each wavelength is different along the optical axis. When achromatized, the shortest and longest wavelengths in the objective lens wavelength range come to a common focus and the lens is considered corrected for primary axial chromatic aberration. Glass types and lens optical powers are carefully selected to achieve primary axial color correction.

To achieve secondary color correction, the center wavelength of the MWIR objective lens wavelength range must also be designed to focus at the same point as the shortest and longest wavelengths. When this is achieved the lens is considered corrected for secondary axial color. Secondary color correction is important, as it is often limits the imaging performance of high resolution lenses.

The contribution of individual optical elements to the total objective lens axial chromatic aberration is proportional to the square of axial marginal ray height at the element, its optical power and it is reciprocal of Abbe number of lens material.

The Abbe number Vλ2 though the definite width of the spectrum is given by:

$$V_{\lambda 2} = (n_{\lambda 2} - 1)/(n_{\lambda 1} - n_{\lambda 3}) \qquad (1)$$

where $n_{\lambda 2}$ is the index of refraction of the glass at the center wavelength λ2 of the required spectrum, n λ1 is the index of refraction at shortest wavelength λ1 of the spectrum and $n_{\lambda 3}$ is the index of refraction at the longest wavelength λ3 of the spectrum.

The smaller the value of $V_{\lambda 2}$, the greater the chromatic dispersion of the glass.

Germanium has a V-value of approximately 100 in the MWIR spectrum and elements from germanium act as flint glass and have negative optical powers. Silicon V-value is 250 and elements from silicon act as crown glass and have positive optical powers. Axial color correction is accomplished by matching different dispersions to the different optical powers. The lack of materials available in the MWIR wavelength range makes this task difficult, along with the generally inability to fabricate cemented achromatic doublets in the infrared.

FIG. 6 (Prior Art) is an infrared materials dispersion chart showing the dispersion characteristics of various infrared materials across a broad frequency wavelength range of 1 0 12 microns.

Relevant patents includes patent CN107505690A that discloses an airborne infrared MWIR prime lens which consists of six optical elements. The lens is compact with a length of only 116.5 mm. However, this lens is not suitable for scanning airborne systems.

Patent US20120162750A1 describes a continuous zoom lens arrangement that can image MWIR and LWIR spectral bands to a common image plane. The lens has an F # of 3. However, it provides low resolution utilizing a 640×480 element focal plane array with 20 micron square pixels.

Therefore, there exists a need in the art for a high performance MidWave InfraRed (MWIR) lens for sensing, and more particularly, to an infrared lens objective used in an airborne remote sensing system, producing an image with a spectral wavelength range of about 3.3 micrometers to 5.1 micrometers.

SUMMARY

An embodiment provides a MidWave InfraRed (MWIR) lens device for remote sensing comprising, in order, from a remote object to an image plane a first optical group having a positive optical power; a second optical group having a positive optical power; a third optical group having a positive optical power; an aperture stop (AS); and a focal plane array (FPA); wherein the lens is corrected over a spectral waveband of 3.3 μm to 5.1 μm, distortion is completely corrected at 0.85 of maximum field, residual distortion does not exceed 0.63 percent, angular field of view is 33.6 degrees, focal length is 9 inches, and F # is 2.64; whereby an image is formed. Further embodiments comprise a scanning mirror before the first optical group. Other embodiments further comprise a first fold mirror between the first optical group and the second optical group; and a second fold mirror between the second optical group and the third optical group, wherein the second fold mirror is configured to bend an optical axis between the second and third optical groups. Subsequent embodiments comprise a Dewar window between the third optical group and the aperture stop. For additional embodiments a cold filter is between the aperture stop and the focal plane array. In another embodiment the first optical group is configured to receive MWIR radiation from the remote object and to direct converged light onto the second optical group; wherein the first optical group consists of three optical elements having, in order, from the remote object to the image plane positive, negative and positive optical powers correspondingly. For a following embodiment the second optical group is configured to further converge light from the first optical group and to direct the converged light onto the third optical group; wherein the second optical group consists of four optical elements having, in order, from the remote object to the image plane positive, negative, positive, and positive optical powers correspondingly; and wherein an intermediate image is positioned between a third and a fourth optical element of the second optical group, and wherein a second optical element of the first optical group is made in a form of a plano-concave lens whose concave surface faces toward the remote image. In subsequent embodiments the third optical group is configured to further converge light from the second optical group and to focus the light through a Dewar window and a cold filter onto the focal plane array; wherein the third optical group consists of three optical elements having, in order, from the remote object to the image plane negative, positive, and positive optical powers correspondingly, and wherein magnification of the third optical group is about 1.4×. In additional embodiments the aperture stop is positioned between a Dewar window and the FPA, wherein a distance from the aperture stop, a length of the cold shield, to the FPA is about 5.77". For yet further embodiments the first optical element of the first optical group is made in a form of a positive meniscus whose concave surface faces toward the remote object; the third optical element of the first optical group is made in a form of a positive meniscus whose concave surface faces toward the remote object; the first optical element of the second optical group is made in a form of a positive meniscus whose concave surface faces toward the remote image; the second optical element the second optical group is made in a form of a positive meniscus whose concave surface faces toward the remote image; the fourth optical element of the second optical group is made in a form of a positive meniscus whose concave surface faces toward the remote object; the second optical element of the third optical group is made in a form of a positive meniscus whose concave surface faces toward the remote object; and the third optical element of the third optical group is made in a form of a positive meniscus whose concave surface faces toward the image. In included embodiments a third optical element of the second optical group is made in a form of a negative meniscus whose concave surface faces toward the image; and a first optical element of the third optical group is made in a form of a negative meniscus whose concave surface faces toward the remote object. In yet further embodiments a first surface of a first optical element of the first optical group is formed aspherical; a second surface of a second optical element of the first optical group is formed aspherical; a second surface of a third optical element of the first optical group is formed aspherical; a second surface of a first element of the second optical group is formed aspherical; a second surface of a second element of the second optical group is formed aspherical; a second surface of a third optical element of the third optical group is formed aspherical; a first surface of a fourth optical element of the second optical group is formed aspherical; a first surface of a first element of the third optical group is formed aspherical; a first surface of a second optical element of the third optical group is formed aspherical; and a second surface of a third optical element of the third optical group is made aspherical. In related embodiments a material of a first optical element of the first optical group is silicon; a third element of the first optical group material is silicon; a first optical element of the second optical group material is silicon; a second optical element of the second optical group material is silicon; a second optical element of the third optical group material is silicon; and a third optical element of the third optical group material is silicon. For further embodiments a material of a second optical element of the first optical group is germanium; a third optical element of the second optical group material is germanium; a fourth optical element of the second optical group material is germanium; a first optical element of the third optical group material is germanium. In ensuing embodiments the following parameters apply: $-0.74<FL/FG1<-0.55$; $-1.15<FL/FG2<-0.9$; $-2.7<FL/FG3<-2.45$; $1.65<FG1/FG2<1.85$; $4.6<FG1/FG3<4.75$; $1.7<FG1/F1<1.95$; $-1.85<FG1/F2<-1.65$; $0.75<FG1/F3<0.85$; $0.55<FG2/F4<0.72$; $0.48<FG2/F5<0.54$; $-0.82<FG2/F6<-0.76$; $0.64<FG2/F7<0.72$; $-0.85<FG3/F8<-0.66$; $0.87<FG3/F9<0.94$; $0.65<FG3/F10<0.68$; $-0.28<FL/OAL<-0.24$; $5.75<OAL/CSD<6.15$; $2.45<V1/V2<2.65$; $2.45<V1/V2<2.65$; $0.95<V1/V3<1.15$; $0.95<V4/V5<1.15$; $2.45<V4/V6<2.65$; $2.45<V4/V7<2.65$; $0.35<V8/V9<0.45$; $0.35<V8/V10<0.45$; $0.44<TP1/TP2<0.48$; $0.95<TP1/TP3<1.15$; $0.95<TP4/TP5<1.15$; $0.44<TP4/TP6<0.48$; $0.44<TP4/TP7<0.48$; $2.15<TP8/TP9<2.19$; and $2.15<TP8/TP10<2.19$; wherein: FL is a focal length of the lens; FG1, FG2, FG3 are focal lengths of the first, second and third optical groups correspondingly; F1, F2, F3, F4, F5, F6, F7, F8, F9, F10 focal lengths of optical elements 1, 2, 3, 4, 5, 6, 7, 8, 9, and 10 correspondingly; OAL is an overall length of the lens; CSD is a cold shield distance from the aperture stop to the focal plane array; V1, V2, V3, V4, V5, V6, V7, V8, V9, V10 are Abbe numbers of the optical elements 1, 2, 3, 4, 5, 6. 7. 8. 9 and 10 correspondingly; and TP1, TP2, TP3, TP4, TP5, TP6, TP7, TP8, TP9, TP10 are thermal powers of the optical elements 1, 2, 3, 4, 5, 6, 7, 8, 9, and 10 correspondingly.

Another embodiment provides a MidWave InfraRed (MWIR) image system comprising a lens system for remote sensing comprising, in order, from an object to an image plane: a scanning mirror; a first optical group having a positive optical power; a first fold mirror; a second optical group having a positive optical power; a second fold mirror; a third optical group having a positive optical power; a Dewar window; an aperture stop (AS); a cold filter; and a focal plane array (FPA); wherein the lens is corrected over the spectral waveband 3.1 μm-5.1 μm to form an MWIR image. For more embodiments the first optical group is configured to receive MWIR radiation from a remote object and to direct converged light onto the second optical group; the first optical group consists of three optical elements having, in order, from the object to the image plane positive, negative, and positive optical powers correspondingly. In continued embodiments the second optical group is configured to further converge light from the first optical group and to direct the converged light onto the third optical group; the second optical group consists of four optical elements having, in order, from the object to the image plane positive, negative, positive, and positive optical powers correspondingly. For additional embodiments the third optical group is configured to further converge light from the second optical group and to focus the light through the Dewar window and the cold filter onto the focal plane array; the third optical group consists of three optical elements having in order from the object to the image plane negative, positive and positive optical powers correspondingly.

A yet further embodiment provides an airborne Mid-Wave Infrared (MWIR) remote sensor comprising, in order, from an object to an image plane a scanning mirror; a first optical group having s positive optical power; a first fold mirror; a second optical group having s positive optical power; a second fold mirror; a third optical group having a positive optical power; a Dewar window; an aperture stop (AS); a cold filter; a focal plane array (FPA); wherein the lens is corrected over the spectral waveband 3.3 μm-5.1 μm; wherein the first optical group is configured to receive MWIR radiation from a remote object and to direct converged light onto the second optical group; the first optical group consists of three optical elements having, in order, from the object to the image plane positive, negative and positive optical powers correspondingly; wherein the first fold mirror is configured to bend an optical axis between the first and second optical groups; wherein the second optical group is configured to further converge light from the first optical group and to direct the converged light onto the third optical group; the second optical group consists of four optical elements having, in order, from the object to the image plane positive, negative, positive and positive optical powers correspondingly; the second fold mirror is configured to bend the optical axis between the second and third optical groups; the third optical group is configured to further converge light from the second optical group and to focus the light through the Dewar window and cold filter onto the focal plane array; the third optical group consists of three optical elements having, in order, from the object to the image plane negative, positive and positive optical powers correspondingly; wherein the aperture stop is positioned between the Dewar window and the FPA; wherein a distance from the aperture stop to the FPA is 5.77"; and wherein only two optical materials are used; hereby an image is formed.

The features and advantages described herein are not all-inclusive and, in particular, many additional features and advantages will be apparent to one of ordinary skill in the art in view of the drawings, specification, and claims. Moreover, it should be noted that the language used in the specification has been selected principally for readability and instructional purposes and not to limit the scope of the inventive subject matter.

These and other features of the present embodiments will be understood better by reading the following detailed description, taken together with the figures herein described. The accompanying drawings are not intended to be drawn to scale. For purposes of clarity, not every component may be labeled in every drawing.

DETAILED DESCRIPTION

According to one embodiment, a Mid-Wave Infrared objective lens with an F # of 2.64 and angular field of view of 33.6° is disclosed. The lens is deployed, in conjunction with a focal plane and scanning system, on an airborne platform for remote sensing applications. The lens is corrected for monochromatic and chromatic aberrations over the MWIR wavelength range of about 3.3 micrometers to 5.1 micrometers. The focal length in one example is about 9 inches. Images of the remote target are formed on a focal plane, which may constitute CCD or CMOS with micro lenses. The overall length of the lens in one example is about 30.45 inches. In an embodiment, the lens comprises, in order from the object to the image, three groups of optical elements with a cold shield/aperture stop located at a distance of about 5.77 inches from the image plane. Also in this embodiment, the first optical group has a positive optical power and includes three optical elements, the second optical group has a positive optical power and includes four optical elements and the third optical group has a positive optical power and includes three optical elements. The objective lens is comprised of only two optical materials, Germanium and Silicon. The powers of the optical groups and elements, their shapes, refractive indices and dispersions of materials are selected such that the lens is both apochromatic and orthoscopic. The lens is used in a scanning system in a pre-objective configuration where the scan mirror is located in front of the lens objective.

Figure 1:
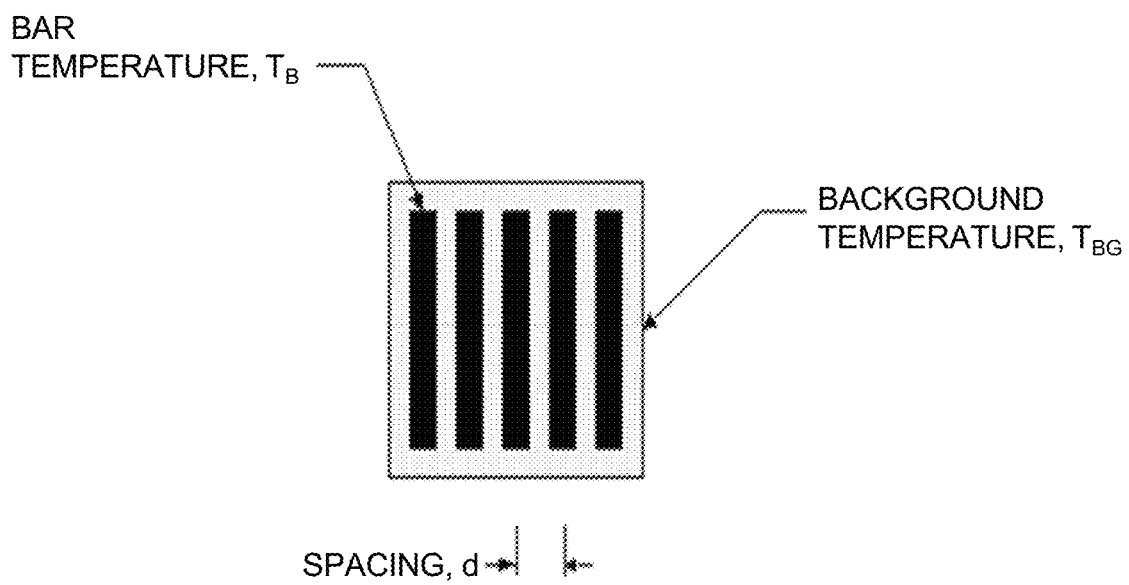
FIG. 1 (Prior Art) depicts an MRTD target test pattern.
Figure 2:
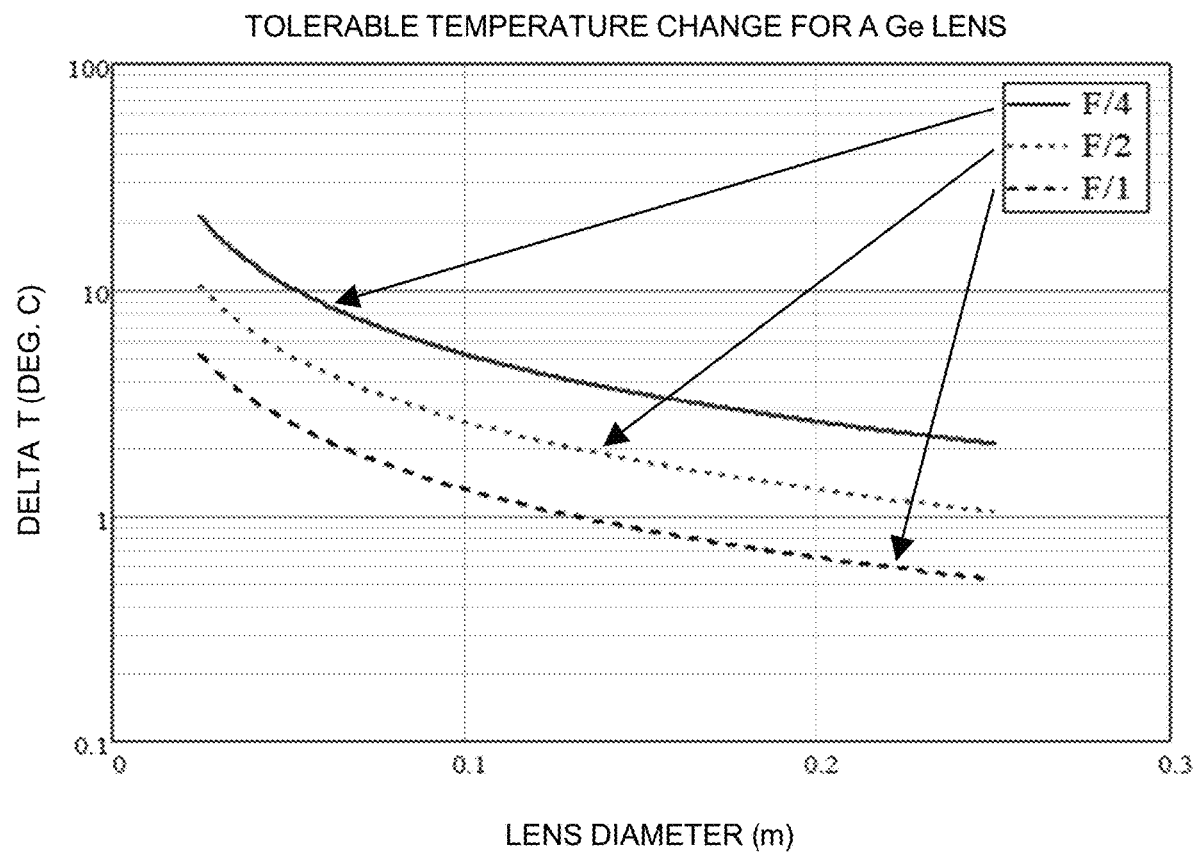
FIG. 2 (Prior Art) is a graph of tolerable temperature change for a Ge lens.
Figure 3:
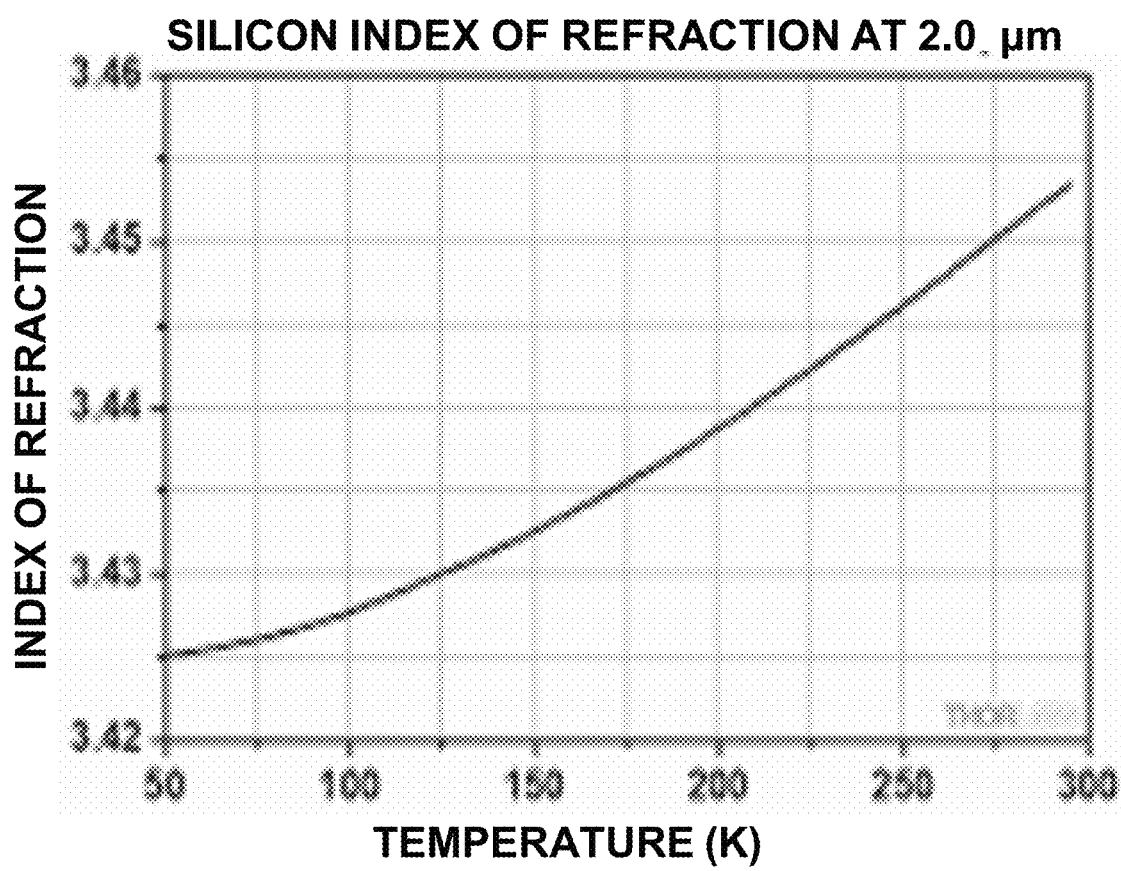
FIG. 3 (Prior Art) is a graph depicting Silicon refractive index change with temperature.
Figure 4:
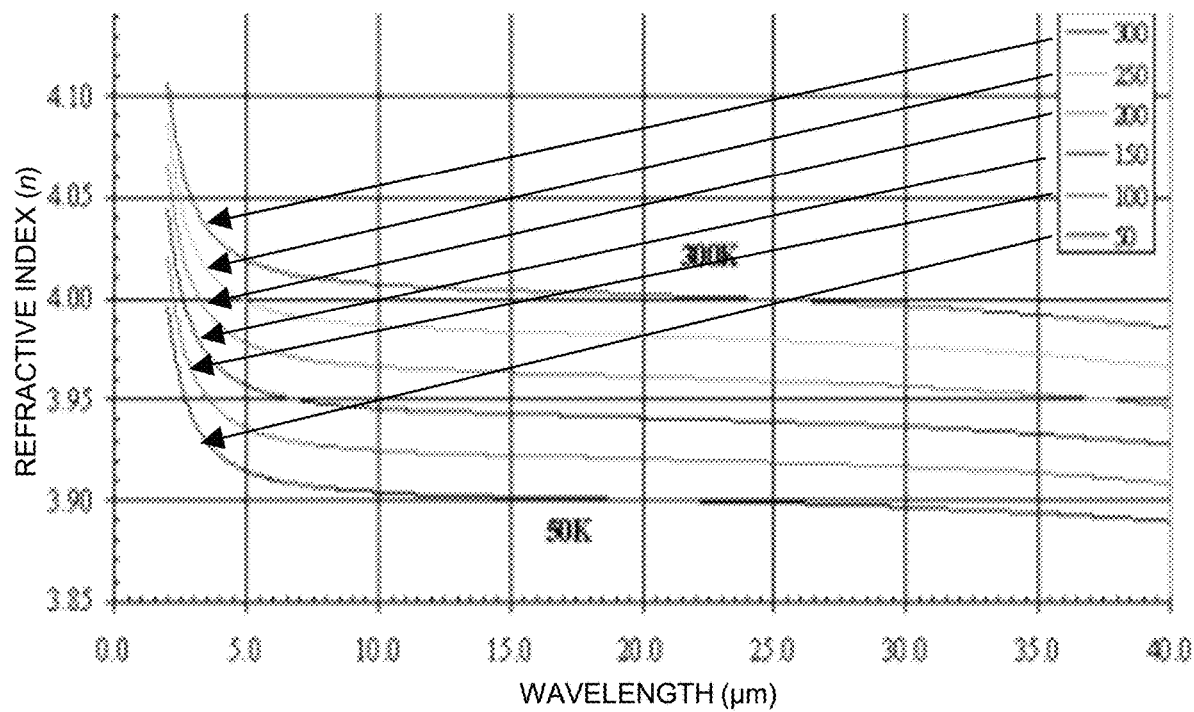
FIG. 4 (Prior Art) is a graph depicting Germanium refractive index change through temperature and spectrum.
Figure 5:
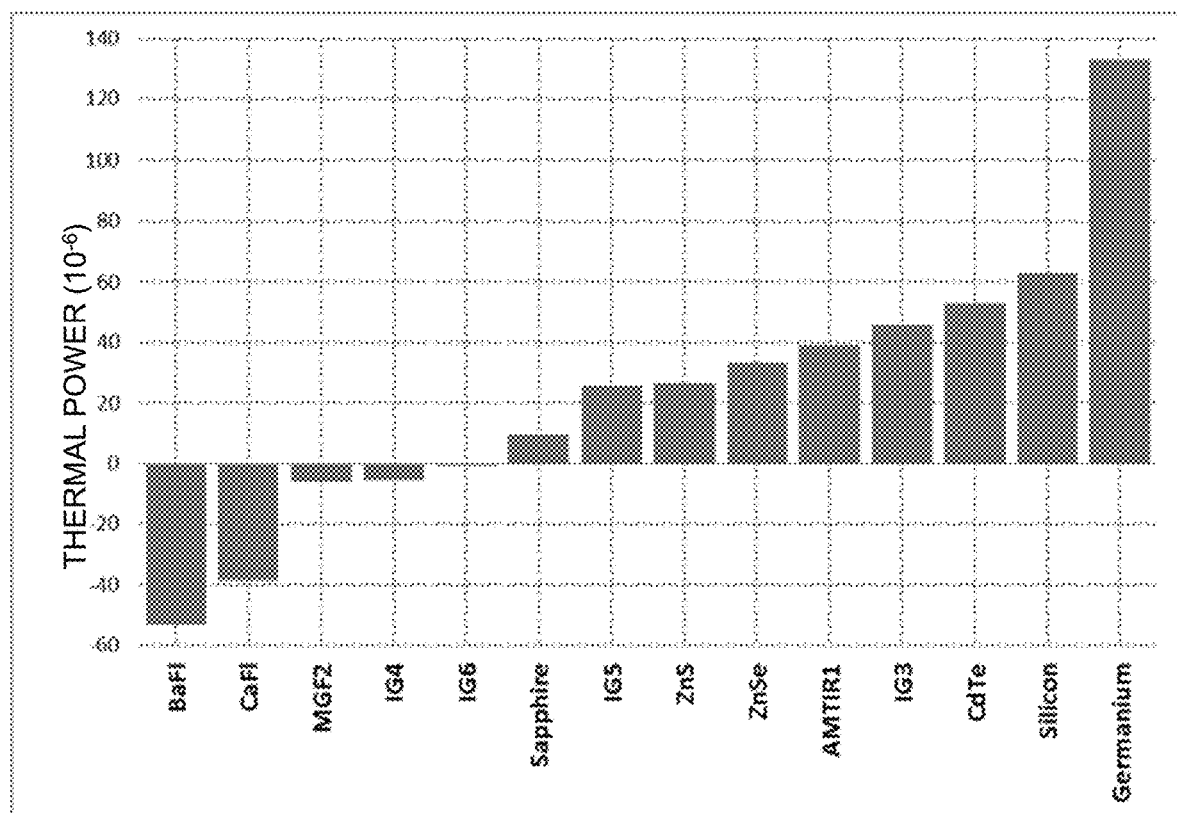
FIG. 5 (Prior Art) is a chart of thermal powers of IR lens materials.
Figure 6:
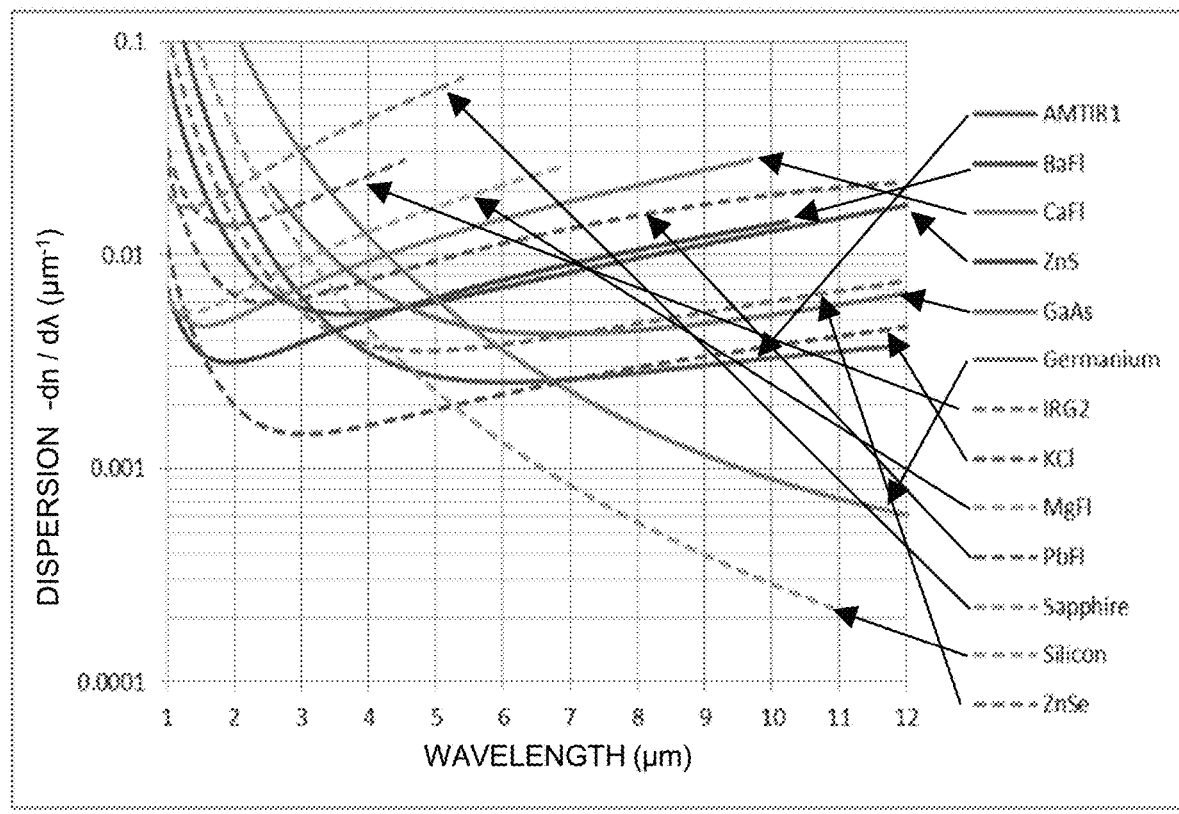
FIG. 6 (Prior Art) is a graph of Infrared materials dispersion.
Figure 7:
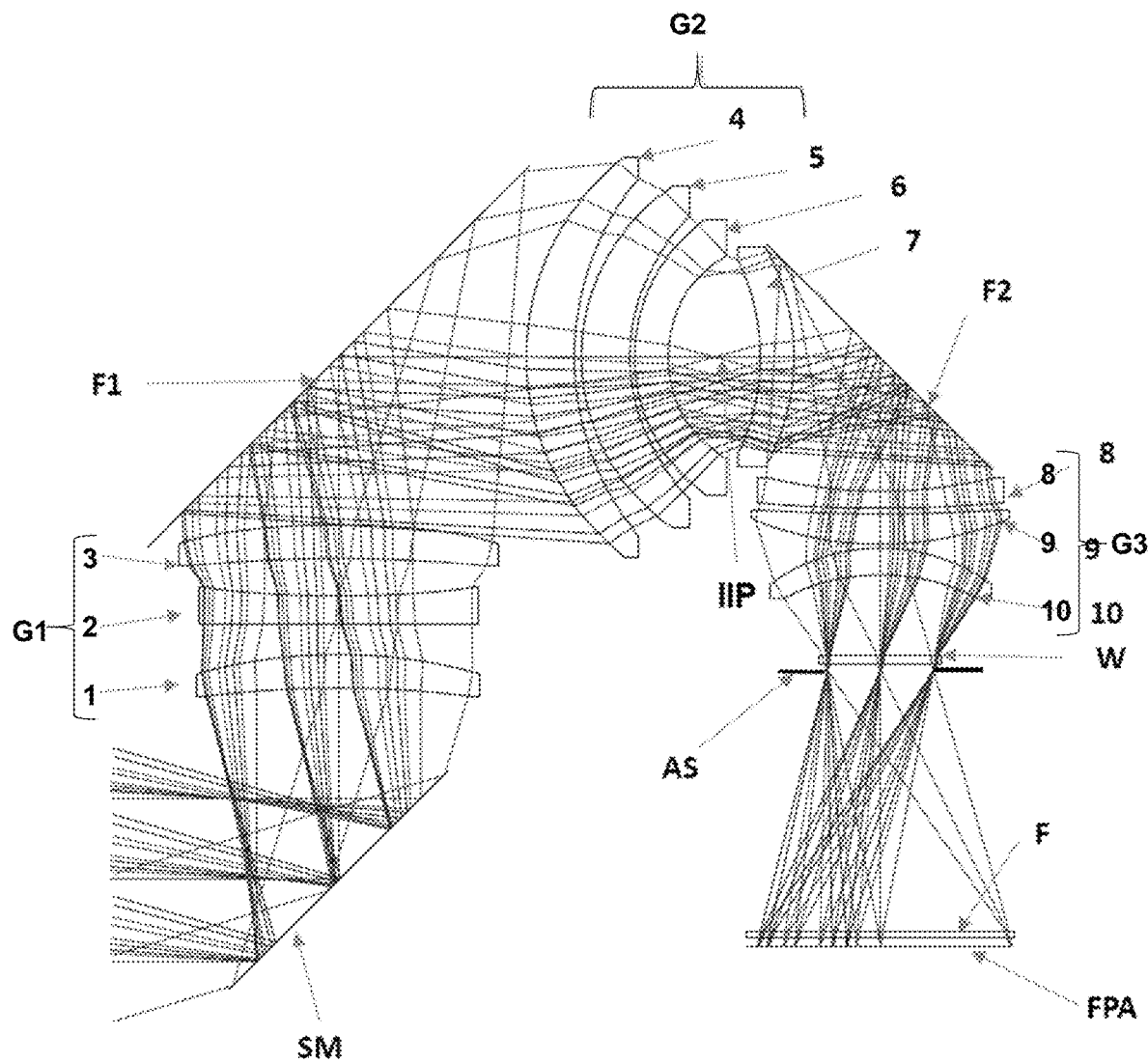
FIG. 7 shows a lens configured in accordance with an embodiment.

FIG. 7 shows an embodiment MWIR lens for remote sensing. The signal from the scene or image is represented by the series of bundled lines entering from the left and striking the scanning mirror SM. In embodiments the MWIR lens for remote sensing includes the scanning mirror SM, the first optical group G1, the first fold mirror F1, the second optical group G2, the second fold mirror F2, the third optical group G3, the Dewar window W, the aperture stop (cold shield) AS, the cold filter F and the focal plane array FPA. Image of the remote target is formed on a focal plane array which constitutes a CCD.

TABLE 3 Specification for this lens is as follows:

| PARAMETER | VALUE |
|---|---|
| Wavelengths | 3.0-5.1 µm |
| EFL | 9 in. |
| F/# | 2.64 |
| Detector | 3.87 × 3.87 in. (5.47 diag.) |
| | 12288 × 12228 pixels (8 µm pitch) |
| IFOV | 35 µrad |
| Distortion | <1% |
| FFOV | 24.3° × 24.3° (33.8° diag.) |
| Fold Mirrors | 2 & FSM |
| Measured MTF Freq. | 31.25 lp/mm |
| | (1/2-Nyquist) |
| Min. MTF across FOV | 0.40 (design) |
| @ 1/2-Nyquist | 0.25 (as-built) |
| Transmission | ≥60% |
| # of Elements | 10 elements |
| | 10 aspheres (1 per element) |
| Element Materials | Ge & Si |

In embodiments the scan mirror SM rotates around two axes with certain steps in order to cover the whole target while obtaining the necessary ground samples.

In embodiments the first optical group G1 has a positive overall optical power and is configured to receive the light (MWIR radiation) from the remote object and to direct converged light onto the second optical group G2. The group G1 consists of first optical element 1, second optical element 2 and third optical element 3.

In embodiments the first optical element 1 has a positive optical power and is made in a form of a positive meniscus whose concave surface faces toward the object. The first surface of the first optical element 1 is formed aspherical in order to correct low order spherical aberration across the numerical aperture. Element 1 material is silicon.

In embodiments the second optical element 2 has a negative optical power and is made in a form of a plano-concave lens whose concave surface faces toward the image. The second surface of the second optical element 2 is formed aspherical in order to correct oblique spherical aberration across the field. Element 2 material is germanium.

In embodiments the third optical element 3 has a positive optical power and is made in a form of positive meniscus whose concave surface faces toward the object. The second surface of the third optical element 3 is formed aspherical on order to correct low order coma. Element 3 material is silicon.

In embodiments the fold mirror F1 is directing the flux from the first optical group G1 to the second optical group G2 in order to make the lens more compact and to fit the volume of the airborne sensor turret.

In embodiments the second optical group G2 has an overall positive optical power and is configured to further converge the light from the first optical group G2 and to direct the light onto the third optical group G3. The group G2 consists of first optical element 4, second optical element 5, third optical element 6 and fourth optical element 7.

In embodiments the first optical element of group G2 has a positive optical power and is made in a form of a positive meniscus whose concave surface faces toward the image. The second surface of the first element 4 is formed aspherical to correct high order coma and sagittal astigmatism. The material of element 4 is silicon.

In embodiments the second optical element 5 of group G2 has a positive optical power and is made in a form of a positive meniscus whose concave surface faces toward the image. The second surface of the second element 5 is formed aspherical in order to correct high order pupil spherical aberration. The material of element 5 is silicon.

In embodiments the third optical element 6 of group G2 has a negative optical power and is made in a form of a negative meniscus whose concave surface faces toward the image. The second surface of the third element 6 is formed aspherical to correct residual field curvature. The material of the element 6 is germanium.

In embodiments the fourth optical element 7 of group 2 has a positive optical power and is made in a form of a positive meniscus whose concave surface faces toward the object. The first surface of the fourth element 7 is formed spherical to correct high order pupil coma and astigmatism. The material of the element 7 is germanium.

In embodiments the intermediate Image Plane (IIP) is located between the elements 6 and 7 of the second optical group. That allows correction of the low order pupil spherical aberration and coma mean across the field.

In embodiments the fold mirror F2 is directing the flux from the second optical group G2 to the third optical group G3 in order to further bend the optical path to make the lens more compact.

In embodiments the third optical group G3 has an overall positive optical power and is configured to farther converge the light from the second optical group G2 and to focus the light through the Dewar window W and cold filter F onto the focal plane arrays FPA. The third optical group G3 conjugates intermediate image plane IIP with the FPA, at that magnification of the third optical group 3 is about 1.4× in order to have a reasonable cold shield distance (from the cold shield to the FPA) and 100% cold shield efficiency.

In embodiments the third optical group G3 consists of three optical elements: first optical element 8, second optical element 9 and third optical element 10.

In embodiments the first optical element 8 of group G3 has a negative optical power and is made in a form of a negative meniscus whose concave surface faces toward the object. The first surface of the element 8 is formed aspherical in order to correct for the meridional high order astigmatism and coma. The material of the element 8 is germanium.

In embodiments the second optical element 9 of group G3 has a positive optical power and is made in a form of a positive meniscus whose concave surface faces toward the object. The first surface of the element 9 is formed aspherical in order to correct high order field curvature. The material of the element 9 is silicon.

In embodiments the third optical element 10 of group G3 has a positive optical power and is made in a form of positive meniscus whose concave surface faces toward the image. The second surface of element 10 is made aspherical in order to correct residual astigmatism and oblique spherical aberration. The material of element 10 is silicon.

In embodiments the aperture stop AS, which determines the cold shield opening, is positioned between the Dewar window and FPA. In embodiments, the distance from the aperture stop (length of the cold shield) to the FPA is 5.77".

In embodiments the following relations among the optical groups G1, G2, G3 and their constituent optical elements have been found to achieve monochromatic and chromatic aberrational correction across the field along with 100% cold shield efficiency.

$$-0.74 < F_L/F_{G1} < -0.55$$

$$-1.15 < F_L/F_{G2} < -0.9$$

$$-2.7 < F_L/F_{G3} < -2.45$$

$$1.65 < F_{G1}/F_{G2} < 1.85$$

$$4.6 < F_{G1}/F_{G3} < 4.75$$

$$1.7 < F_{G1}/F_1 < 1.95$$

$$-1.85 < F_{G1}/F_2 < -1.65$$

$$0.75 < F_{G1}/F_3 < 0.85$$

$$0.55 < F_{G2}/F_4 < 0.72$$

$$0.48 < F_{G2}/F_5 < 0.54$$

$$-0.82 < F_{G2}/F_6 < -0.76$$

$$0.64 < F_{G2}/F_7 < 0.72$$

$$-0.85 < F_{G3}/F_8 < -0.66$$

$$0.87 < F_{G3}/F_9 < 0.94$$

$$0.65 < F_{G3}/F_{10} < 0.68$$

$$-0.28 < F_L/OAL < -0.24$$

$$5.75 < OAL/CSD < 6.15$$

$$2.45 < V_1/V_2 < 2.65$$

$$2.45 < V_1/V_2 < 2.65$$

$$0.95 < V_1/V_3 < 1.15$$

$$0.95 < V_4/V_5 < 1.15$$

$$2.45 < V_4/V_6 < 2.65$$

$$2.45 < V_4/V_7 < 2.65$$

$$0.35 < V_8/V_9 < 0.45$$

$$0.35 < V_8/V_{10} < 0.45$$

$$0.44 < TP_1/TP_2 < 0.48$$

$$0.95 < TP_1/TP_3 < 1.15$$

$$0.95 < TP_4/TP_5 < 1.15$$

$$0.44 < TP_4/TP_6 < 0.48$$

$0.44 < TP_4/TP_7 < 0.48$ $2.15 < TP_8/TP_9 < 2.19$ $2.15 < TP_8/TP_{10} < 2.19$

Wherein:

FL is the focal length of the lens according to an embodiment;

FG1, FG2, FG3—are the focal lengths of the first, second and third optical groups correspondingly;

F1, F2, F3, F4, F5, F6, F7, F8, F9, F10—are the focal lengths of the optical elements 1, 2, 3, 4, 5, 6. 7. 8. 9 and 10 correspondingly;

OAL is the overall length of the lens;

CSD is the cold shield distance from the aperture stop to the focal plane array FPA;

V1, V2, V3, V4, V5, V6, V7, V8, V9, V10 are the Abbe numbers of the optical elements 1, 2, 3, 4, 5, 6. 7. 8. 9 and 10 correspondingly;

TP1, TP2, TP3, TP4, TP5, TP6, TP7, TP8, TP9, TP10 are the thermal powers of the optical elements 1, 2, 3, 4, 5, 6. 7. 8. 9 and 10 correspondingly.

Described above relations between the focal lengths of the optical groups G1, G2, and G3 provide lens with a long focal length of 9 inches along with a 100% efficient cold shield along with desired cold shield distance of 5.77 inches. These relations provide Petzval curvature correction as well.

Mutual combination of optical elements materials' dispersions allows axial chromatic aberration correction along with a lateral color correction.

Mutual combination of optical elements configuration and specific usage of aspherical surfaces allows achieving low F # Of 2.64 while having large field of view of 33.6°.

On-axis spherical aberration and off-axis aberrations such as coma, astigmatism and high order field curvature are corrected. Lens is orthoscopic—has very low distortion of less than 1%.

Mutual combination of optical elements thermal powers and Aluminum barrel CTE of 24*10-6(m/mK) provides an acceptable defocus over the temperature range of −20° C. to +40° C. Thermally induced defocus as well as altitude change from sea level to 18000 feet are compensated by the axial motion of the first optical group G1. Total range of the motion of the first group G1 is 0.13 inches.

Figure 8:
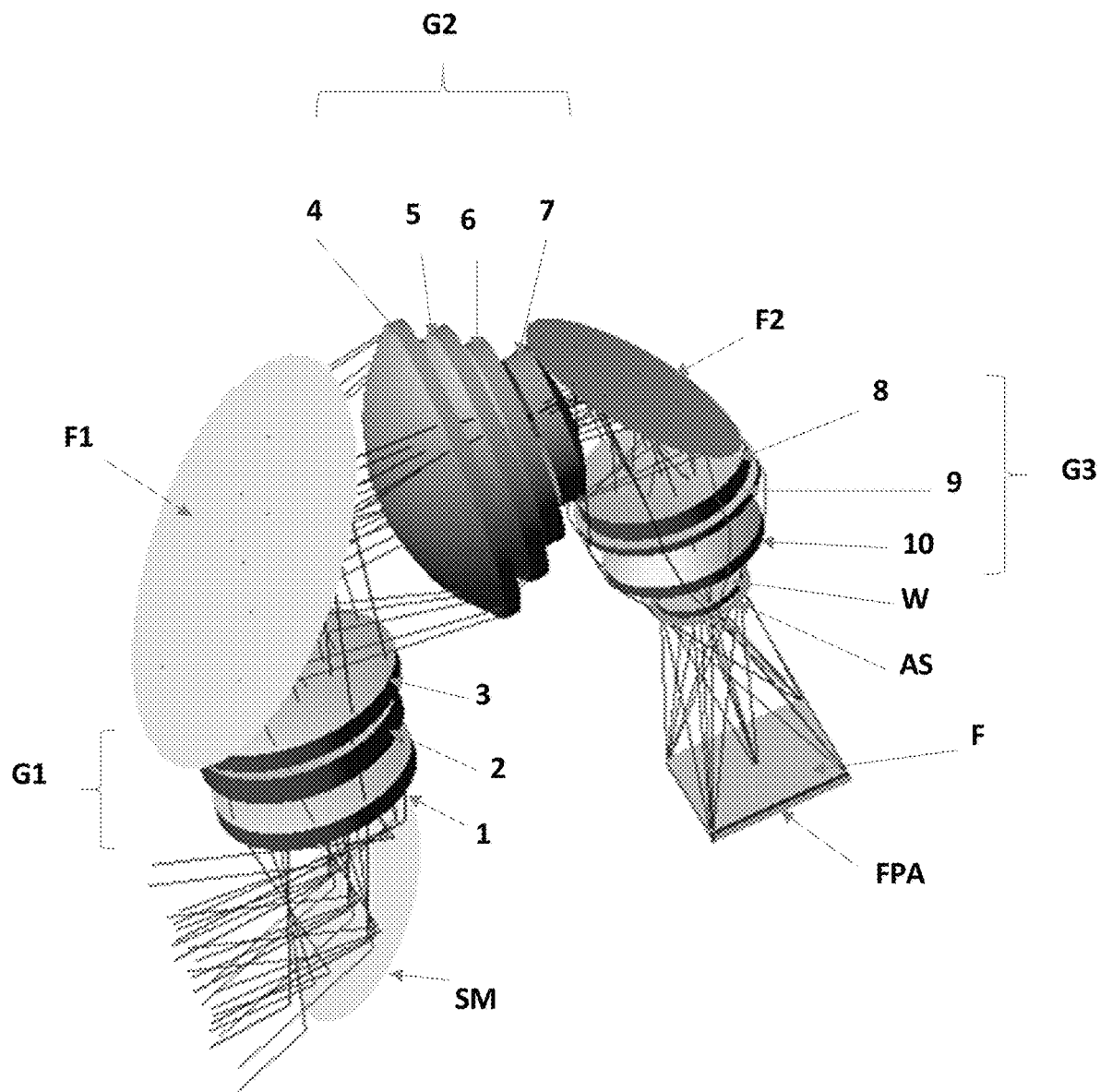
FIG. 8 shows a 3D lens configuration in accordance with an embodiment.

FIG. 8 is a 3D configuration of the MWIR lens for remote sensing for an embodiment of the lens. The lens consists of scanning mirror SM, optical groups G1, G2 and G3. First fold mirror F1 and second fold mirror F2 are located between the first optical group and the second optical group and between the second optical group and the third optical group correspondingly. First optical group G1 includes three optical elements 1, 2 and 3. Second optical group G2 includes four optical elements 4, 5, 6 and 7. Third optical group G3 includes three optical elements 8, 9 and 10. Dewar window W is positioned before the aperture stop AS. Cold filter F is positioned before the focal plane array FPA.

Figure 9:
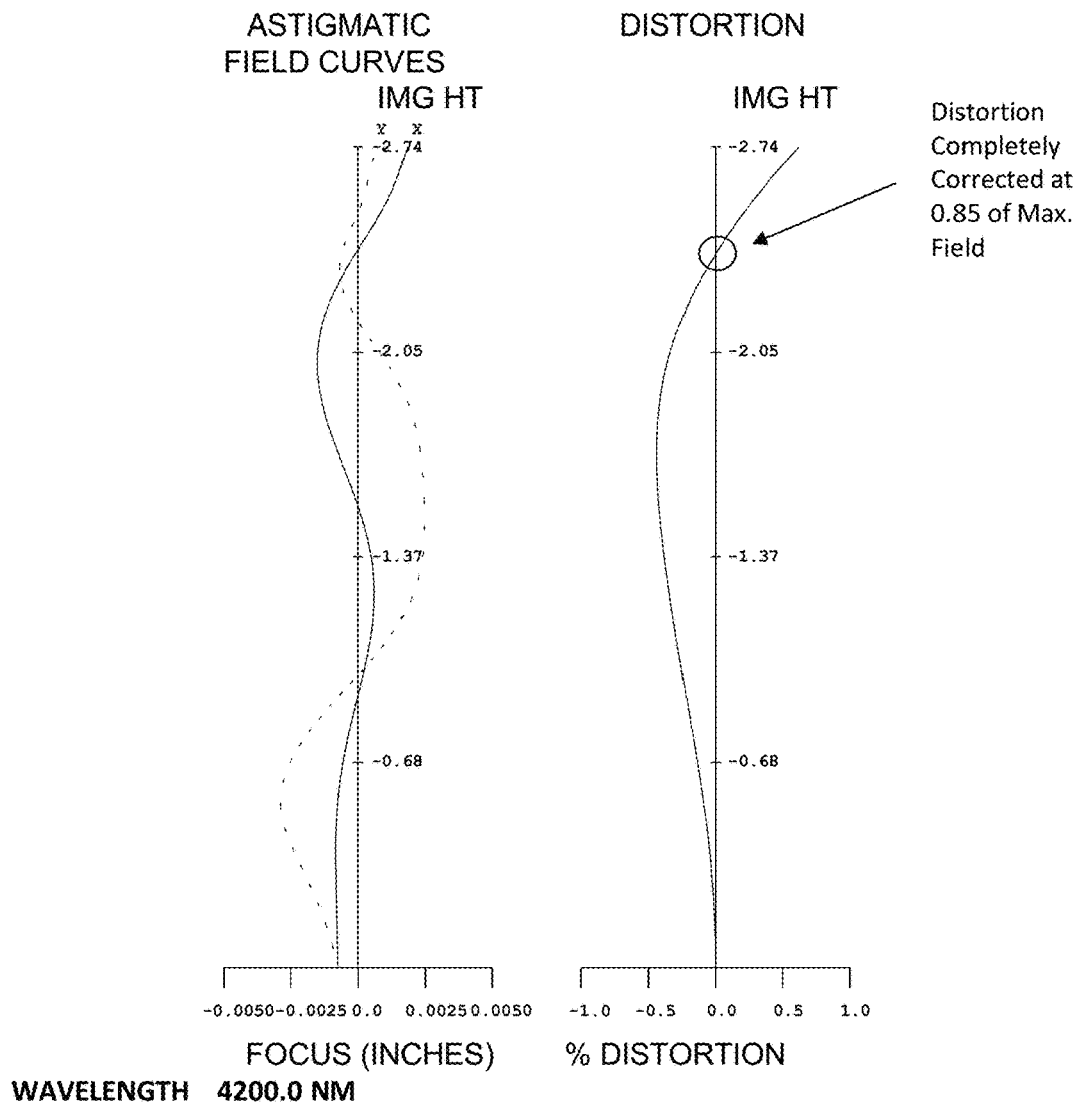
FIG. 9 shows astigmatism and distortion data configured in accordance with an embodiment.

FIG. 9 depicts astigmatic field curves and a distortion graph and table of an embodiment of the lens. Astigmatism is low, and is double corrected across the field. Distortion is completely corrected at 0.85 of maximum field and residual distortion does not exceed 0.63%.

The foregoing description of the embodiments has been presented for the purposes of illustration and description. It is not intended to be exhaustive or to limit the invention to the precise form disclosed. Many modifications and variations are possible in light of this disclosure. It is intended that the scope of the present disclosure be limited not by this detailed description, but rather by the claims appended hereto.

A number of implementations have been described. Nevertheless, it will be understood that various modifications may be made without departing from the scope of the disclosure. Although operations are depicted in the drawings in a particular order, this should not be understood as requiring that such operations be performed in the particular order shown or in sequential order, or that all illustrated operations be performed, to achieve desirable results.

Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure. Other and various embodiments will be readily apparent to those skilled in the art, from this description, figures, and the claims that follow. It is intended that the scope of the invention be limited not by this detailed description, but rather by the claims appended hereto.

What is claimed is:

1. A MidWave InfraRed (MWIR) lens device for remote sensing comprising, in order, from a remote object to an image plane:
    a first optical group having a positive optical power;
    a second optical group having a positive optical power;
    a third optical group having a positive optical power;
    an aperture stop (AS); and
    a focal plane array (FPA);
    wherein the lens is corrected over a spectral waveband of 3.3 µm to 5.1 µm, distortion is completely corrected at 0.85 of maximum field, angular field of view is 33.6 degrees, focal length is 9 inches, and F # is 2.64;
    whereby an image is formed.

2. The MWIR lens device for remote sensing of claim 1 further comprising:
    a scanning mirror before the first optical group.

3. The MWIR lens device for remote sensing of claim 1 further comprising:
    a first fold mirror between the first optical group and the second optical group; and
    a second fold mirror between the second optical group and the third optical group, wherein the second fold mirror is configured to bend an optical axis between the second and third optical groups.

4. The MWIR lens device for remote sensing of claim 1 further comprising:
    a Dewar window between the third optical group and the aperture stop.

5. The MWIR lens device for remote sensing of claim 1 further comprising:
    a cold filter between the aperture stop and the focal plane array.

6. The MWIR lens device for remote sensing of claim 1 wherein the first optical group is configured to receive MWIR radiation from the remote object and to direct converged light onto the second optical group;
    wherein the first optical group consists of three optical elements having, in order, from the remote object to the image plane positive, negative and positive optical powers correspondingly.

7. The MWIR lens device for remote sensing of claim 1 wherein the second optical group is configured to further converge light from the first optical group and to direct the converged light onto the third optical group;
wherein the second optical group consists of four optical elements having, in order, from the remote object to the image plane positive, negative, positive, and positive optical powers correspondingly; and wherein an intermediate image is positioned between a third and a fourth optical element of the second optical group, and wherein a second optical element of the first optical group is made in a form of a plano-concave lens whose concave surface faces toward the remote image.

8. The MWIR lens device for remote sensing of claim 1 wherein the third optical group is configured to further converge light from the second optical group and to focus the light through a Dewar window and a cold filter onto the focal plane array;
wherein the third optical group consists of three optical elements having, in order, from the remote object to the image plane negative, positive, and positive optical powers correspondingly, and wherein magnification of the third optical group is about 1.4×.

9. The MWIR lens device for remote sensing of claim 1 wherein the aperture stop is positioned between a Dewar window and the FPA, wherein a distance from the aperture stop, a length of the cold shield, to the FPA is about 5.77".

10. The MWIR lens device for remote sensing of claim 1 wherein the first optical element of the first optical group is made in a form of a positive meniscus whose concave surface faces toward the remote object;
the third optical element of the first optical group is made in a form of a positive meniscus whose concave surface faces toward the remote object;
the first optical element of the second optical group is made in a form of a positive meniscus whose concave surface faces toward the remote image;
the second optical element the second optical group is made in a form of a positive meniscus whose concave surface faces toward the remote image;
the fourth optical element of the second optical group is made in a form of a positive meniscus whose concave surface faces toward the remote object;
the second optical element of the third optical group is made in a form of a positive meniscus whose concave surface faces toward the remote object; and
the third optical element of the third optical group is made in a form of a positive meniscus whose concave surface faces toward the image.

11. The MWIR lens device for remote sensing of claim 1 wherein a third optical element of the second optical group is made in a form of a negative meniscus whose concave surface faces toward the image; and
a first optical element of the third optical group is made in a form of a negative meniscus whose concave surface faces toward the remote object.

12. The MWIR lens device for remote sensing of claim 1 wherein a first surface of a first optical element of the first optical group is formed aspherical;
a second surface of a second optical element of the first optical group is formed aspherical;
a second surface of a third optical element of the first optical group is formed aspherical;
a second surface of a first element of the second optical group is formed aspherical;
a second surface of a second element of the second optical group is formed aspherical;
a second surface of a third optical element of the third optical group is formed aspherical;
a first surface of a fourth optical element of the second optical group is formed aspherical;
a first surface of a first element of the third optical group is formed aspherical;
a first surface of a second optical element of the third optical group is formed aspherical; and
a second surface of a third optical element of the third optical group is made aspherical.

13. The MWIR lens device for remote sensing of claim 1 wherein a material of a first optical element of the first optical group is silicon;
a third element of the first optical group material is silicon;
a first optical element of the second optical group material is silicon;
a second optical element of the second optical group material is silicon;
a second optical element of the third optical group material is silicon; and
a third optical element of the third optical group material is silicon.

14. The MWIR lens device for remote sensing of claim 1 wherein a material of a second optical element of the first optical group is germanium;
a third optical element of the second optical group material is germanium;
a fourth optical element of the second optical group material is germanium;
a first optical element of the third optical group material is germanium.

15. The MWIR lens device for remote sensing of claim 1 wherein:

$-0.74 < FL/FG1 < -0.55;$ $-1.15 < FL/FG2 < -0.9;$ $-2.7 < FL/FG3 < -2.45;$ $1.65 < FG1/FG2 < 1.85;$ $4.6 < FG1/FG3 < 4.75;$ $1.7 < FG1/F1 < 1.95;$ $-1.85 < FG1/F2 < -1.65;$ $0.75 < FG1/F3 < 0.85;$ $0.55 < FG2/F4 < 0.72;$ $0.48 < FG2/F5 < 0.54;$ $-0.82 < FG2/F6 < -0.76;$ $0.64 < FG2/F7 < 0.72;$ $-0.85 < FG3/F8 < -0.66;$ $0.87 < FG3/F9 < 0.94;$ $0.65 < FG3/F10 < 0.68;$ $-0.28 < FL/OAL < -0.24;$ $5.75 < OAL/CSD < 6.15;$ $2.45 < V1/V2 < 2.65;$ $2.45 < V1/V2 < 2.65;$ $0.95 < V1/V3 < 1.15;$ $0.95 < V4/V5 < 1.15;$ $2.45 < V4/V6 < 2.65;$ $2.45 < V4/V7 < 2.65;$ $0.35 < V8/V9 < 0.45;$ $0.35 < V8/V10 < 0.45;$ $0.44 < TP1/TP2 < 0.48;$ $0.95 < TP1/TP3 < 1.15;$ $0.95 < TP4/TP5 < 1.15;$ $0.44 < TP4/TP6 < 0.48;$ $0.44 < TP4/TP7 < 0.48;$ $2.15 < TP8/TP9 < 2.19;$ and $2.15 < TP8/TP10 < 2.19;$ wherein:
FL is a focal length of the lens;
FG1, FG2, FG3 are focal lengths of the first, second and third optical groups correspondingly;
wherein the first optical group comprises a first optical element, a second optical element and a third optical element having focal lengths of F1, F2, and F3;
wherein the second optical group comprises a fourth optical element, a fifth optical element, a sixth optical element, and a seventh optical element having focal lengths of F4, F5, F6, and F7;
wherein the third optical group comprises an eighth optical element, a ninth optical element and a tenth optical element having focal lengths of F8, F9, and F10;
OAL is an overall length of the lens;
CSD is a cold shield distance from the aperture stop to the focal plane array;
V1, V2, V3, V4, V5, V6, V7, V8, V9, V10 are Abbe numbers of the first optical element, second optical element, third optical element, fourth optical element, fifth optical element, sixth optical element, seventh optical element, eighth optical element, ninth optical element, and tenth optical element, correspondingly; and
TP1, TP2, TP3, TP4, TP5, TP6, TP7, TP8, TP9, TP10 are thermal powers of the optical elements 1, 2, 3, 4, 5, 6. 7. 8. 9 and 10 correspondingly.

16. A MidWave InfraRed (MWIR) image system comprising:
a lens system for remote sensing comprising, in order, from an object to an image plane:
a scanning mirror;
a first optical group having a positive optical power;
a first fold mirror;
a second optical group having a positive optical power;
a second fold mirror;
a third optical group having a positive optical power;
a Dewar window;
an aperture stop (AS);
a cold filter; and
a focal plane array (FPA);
wherein the second optical group is configured to further converge light from the first optical group and to direct the converged light onto the third optical group;
the second optical group consists of four optical elements having, in order, from the object to the image plane positive, negative, positive, and positive optical powers correspondingly; and
wherein the lens is corrected over the spectral waveband 3.1 µm-5.1 µm to form an MWIR image.

17. The system of claim 16, wherein the first optical group is configured to receive MWIR radiation from a remote object and to direct converged light onto the second optical group;
the first optical group consists of three optical elements having, in order, from the object to the image plane positive, negative, and positive optical powers correspondingly.

18. The system of claim 16, wherein the third optical group is configured to further converge light from the second optical group and to focus the light through the Dewar window and the cold filter onto the focal plane array;
the third optical group consists of three optical elements having in order from the object to the image plane negative, positive and positive optical powers correspondingly.

19. An airborne Mid-Wave Infrared (MWIR) remote sensor comprising, in order, from an object to an image plane:
a scanning mirror;
a first optical group having s positive optical power;
a first fold mirror;
a second optical group having s positive optical power;
a second fold mirror;
a third optical group having a positive optical power;
a Dewar window;
an aperture stop (AS);
a cold filter;
a focal plane array (FPA);
wherein the lens is corrected over the spectral waveband 3.3 µm-5.1 µm;
wherein the first optical group is configured to receive MWIR radiation from a remote object and to direct converged light onto the second optical group;
the first optical group consists of three optical elements having, in order, from the object to the image plane positive, negative and positive optical powers correspondingly;
wherein the first fold mirror is configured to bend an optical axis between the first and second optical groups;
wherein the second optical group is configured to further converge light from the first optical group and to direct the converged light onto the third optical group;
the second optical group consists of four optical elements having, in order, from the object to the image plane positive, negative, positive and positive optical powers correspondingly;
the second fold mirror is configured to bend the optical axis between the second and third optical groups;
the third optical group is configured to further converge light from the second optical group and to focus the light through the Dewar window and cold filter onto the focal plane array;
the third optical group consists of three optical elements having, in order, from the object to the image plane negative, positive and positive optical powers correspondingly;

wherein the aperture stop is positioned between the Dewar window and the FPA;
wherein a distance from the aperture stop to the FPA is 5.77"; and
wherein only two optical materials are used;
whereby an image is formed.

* * * * *